United States Patent [19]

Simon et al.

[11] 4,308,525
[45] Dec. 29, 1981

[54] DUAL SPEED RESOLVER TO DIGITAL CONVERTER WITH IMPROVED COURSE-FINE INTERLOCK

[75] Inventors: David J. Simon, Glen Rock; James J. Duckworth, Rockaway, both of N.J.

[73] Assignee: The Singer Company, Little Falls, N.J.

[21] Appl. No.: 158,188

[22] Filed: Jun. 11, 1980

[51] Int. Cl.³ ............................................. H03K 13/02
[52] U.S. Cl. ............................................. 340/347 SY
[58] Field of Search ............... 340/347 SY, 347 AD, 340/347 M; 318/654–661; 364/816

[56] References Cited

U.S. PATENT DOCUMENTS

| 3,277,461 | 10/1966 | Selvin | 340/347 SY |
| 3,315,253 | 4/1967 | Geller | 340/347 SY |
| 3,990,062 | 11/1976 | Miller | 340/347 SY |
| 4,164,729 | 8/1979 | Simon | 340/347 SY |

FOREIGN PATENT DOCUMENTS 1190754  5/1970  United Kingdom ......... 340/347 SY

Primary Examiner—Charles D. Miller
Attorney, Agent, or Firm—John C. Altmiller; Thomas W. Kennedy

[57] ABSTRACT

A dual speed resolver to digital conversion system with coarse and fine interlocking. The reference frequency is utilized to drive a bang-bang servo loop under priority control of the coarse mathetics when it is necessary to pass control to the coarse loop.

10 Claims, 3 Drawing Figures

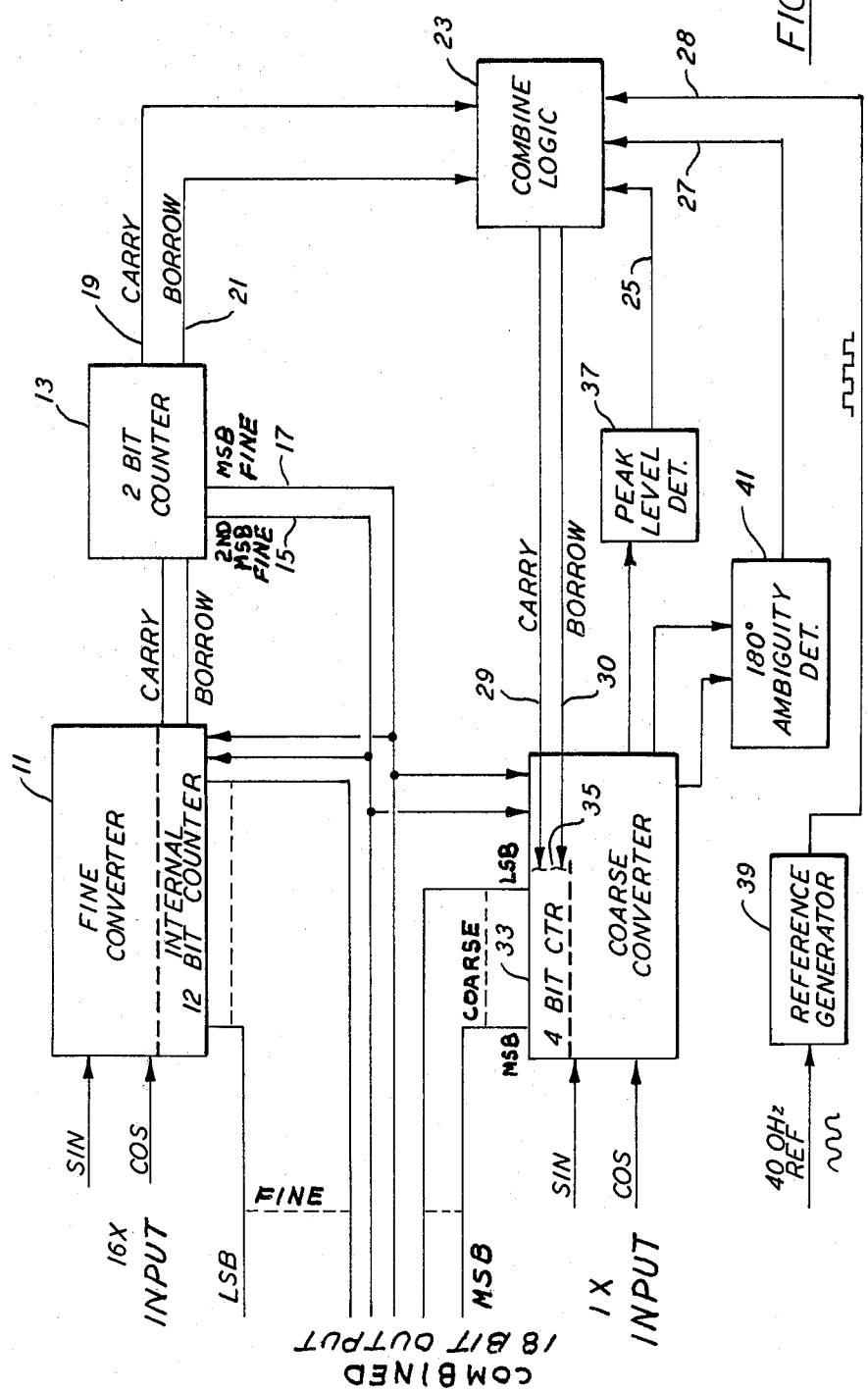

DUAL SPEED RESOLVER TO DIGITAL CONVERTER WITH IMPROVED COURSE-FINE INTERLOCK

This invention relates to digital to resolver converters in general and more particularly to an improved two speed digital to resolver converter.

Resolvers and synchros are well known for their capability to sense shaft angles and provide, as outputs, analog signals proportional to the sine and cosine of the shaft angle. It is also well known that the sine and cosine signals can be converted into a digital signal by means of a synchro or resolver to digital converter. Typical of such converters is the one disclosed and claimed in U.S. Pat. No. 4,164,729. The converter disclosed therein is a 14 bit converter. The maximum accuracy obtainable in such a converter is governed by the number of bits. Although increased accuracy may be obtainable by increasing the number of bits in the converter, the resolver has a certain inherent accuracy which would make this useless. Thus, when greater accuracy than is obtainable with a single resolver and its associated converter is necessary, it is conventional to go to a two speed system. Typical is a system which includes two resolver windings one of which provides rotational outputs corresponding to a single rotation of the shaft angle and the other of which rotates through a multiple of, e.g. 16, rotations for a 360° revolution of the shaft. Such resolvers are currently available as pancake resolvers having what is known as a 1x and a 16x output. In other words a one times and sixteen times output. Alternatively two separate resolvers with gearing therebetween may be used. During normal operation, the fine or sixteen times resolver is always in control. Only in unusual and slewing circumstances is there likely to be an error developed with respect to the coarse resolver.

Previously there were two common approaches for generating a single digital word from the coarse-fine information. One approach made use of two separate resolver to digital converters. Included was a limited resolution device to digitize the coarse output and, most typically, a standard 14 bit device for converting the fine information. The system also included a digital combiner to generate a single digital word of appropriate resolution. Generally, there was at least a two bit overlap between the fine and coarse digital signals to prevent ambiguities. In this approach, although it is straight forward, there is a needless duplication of control loops in the two converters and much additional hardware is required for the digital combiner.

A second, commonly used approach avoids the shortcomings of the first approach. It incorporates the mathematics of both coarse and fine converters and employs limit sensing to allow one tracking loop to respond to inputs from either the coarse loop, which has priority, or the fine loop. This single tracking loop controls one counter chain in which the final output word is stored. This approach still requires a moderate amount of circuitry for signal translation and limit sensing, but, more importantly, use of the single tracking loop, which typically simulates a type two servo loop, does not permit a smooth transistion from coarse to fine control during slewing and does not address itself to problems involving a 180° ambiguity and stick offs.

Thus, the need for an improved two speed resolver to digital converter which avoids the problems present in these two previous approaches becomes evident.

SUMMARY OF THE INVENTION

The present invention provides a solution to this problem with a minimum amount of hardware and without the undesirable control problems which are present in the second approach noted above. In other words, the present invention recognizes that allowing the coarse mathematics control over the type 2 tracking loop in the second approach noted above is undesirable. Moreover, it is based on the recognition that, except during slew rate limited or step response conditions, normal operation will always see control in the hands of the fine channel. Thus, in accordance with the present invention, the reference frequency is utilized to drive a bang-bang servo loop under priority control of the coarse mathematics when it is necessary to pass control to the coarse loop. That is, under normal conditions, the fine mathematics control the counter chain such that the coarse mathematics will always be at a null or close to a null. If this null does not exist, the phasing of the error signal is used, in conjunction with a frequency derived from the reference voltage, to step the coarse section of the counter chain in the proper direction until a null is reached. The stepping rate is the 400 Hz reference frequency, resulting in a fast step response maximum slewing speed of 2250° per second. By comparison, the maximum required tracking rate under fine control is typically 50° per second.

The present converter also includes a phase comparator which incorporates a 180° ambiguity detection circuit which drives the coarse section of the counter chain out of a false null, i.e., a null displaced 180° from that desired, also at the 400 Hz rate. In the embodiment disclosed in detail below, the converter includes a 6 bit coarse section mathematics, a null detector, phase detector and digital logic up-down, bang-bang control, in addition to a standard 14 bit resolver to digital converter used to digitize the fine information. The converter is of a small size, being mounted on two printed circuit boards housed in a module 3½ by 3¼ by 0.82 inches. Tests of the complete encoder system including the converter of the present invention and a standard size 25 pancake resolver containing 1x and 16x windings resulted in a overall maximum error which did not exceed 25 arc seconds.

BRIEF DESCRIPTION OF THE DRAWINGS

FIG. 1 is a block diagram of the converter of the present invention.

FIG. 2A and FIG. 2B show a circuit-logic diagram of the converter of FIG. 1.

DETAILED DESCRIPTION OF THE INVENTION

Figures 2, 2A:
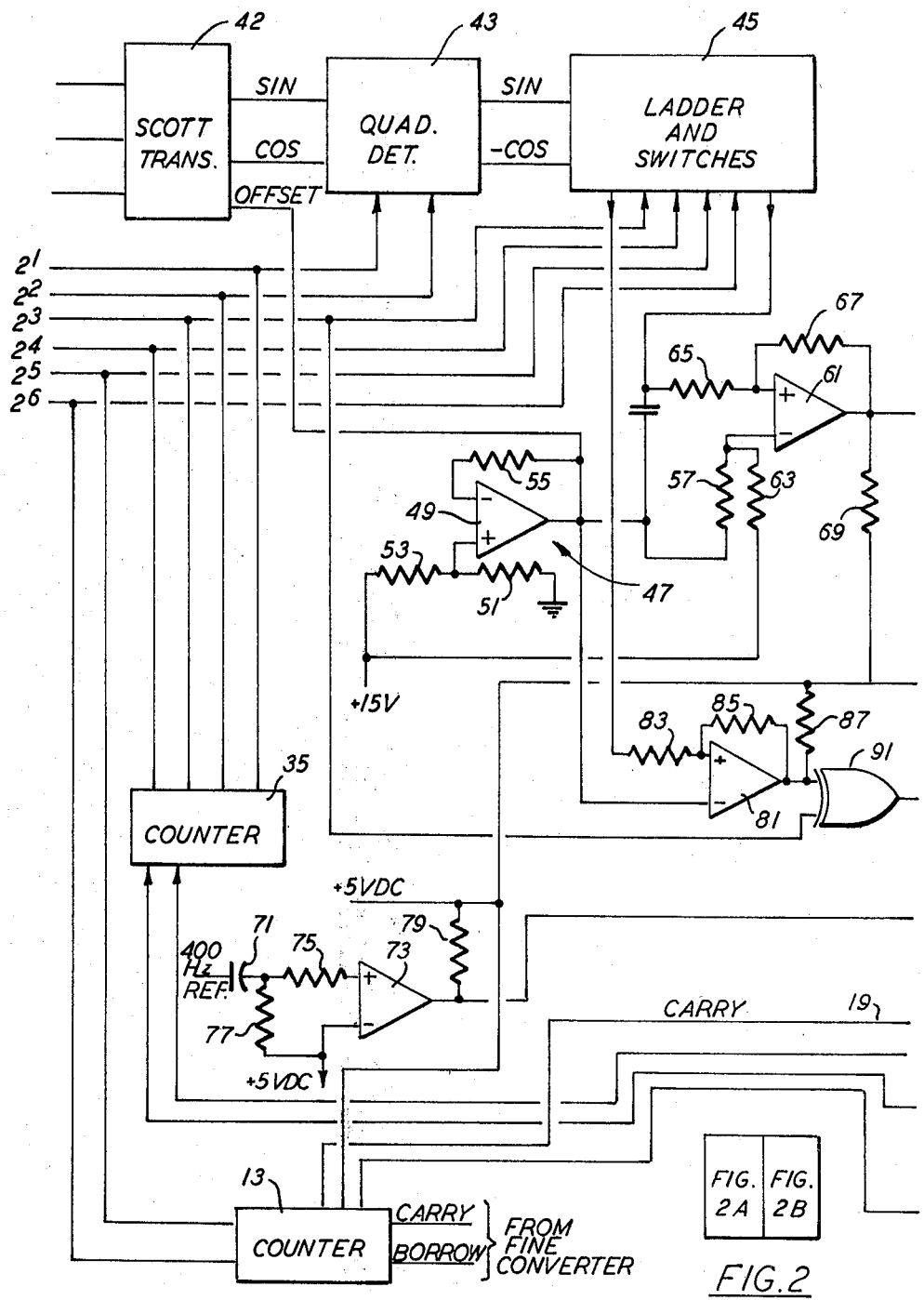
FIG. 2 shows how
FIG. 2A and 2B are interconnected.
Figure 2B:
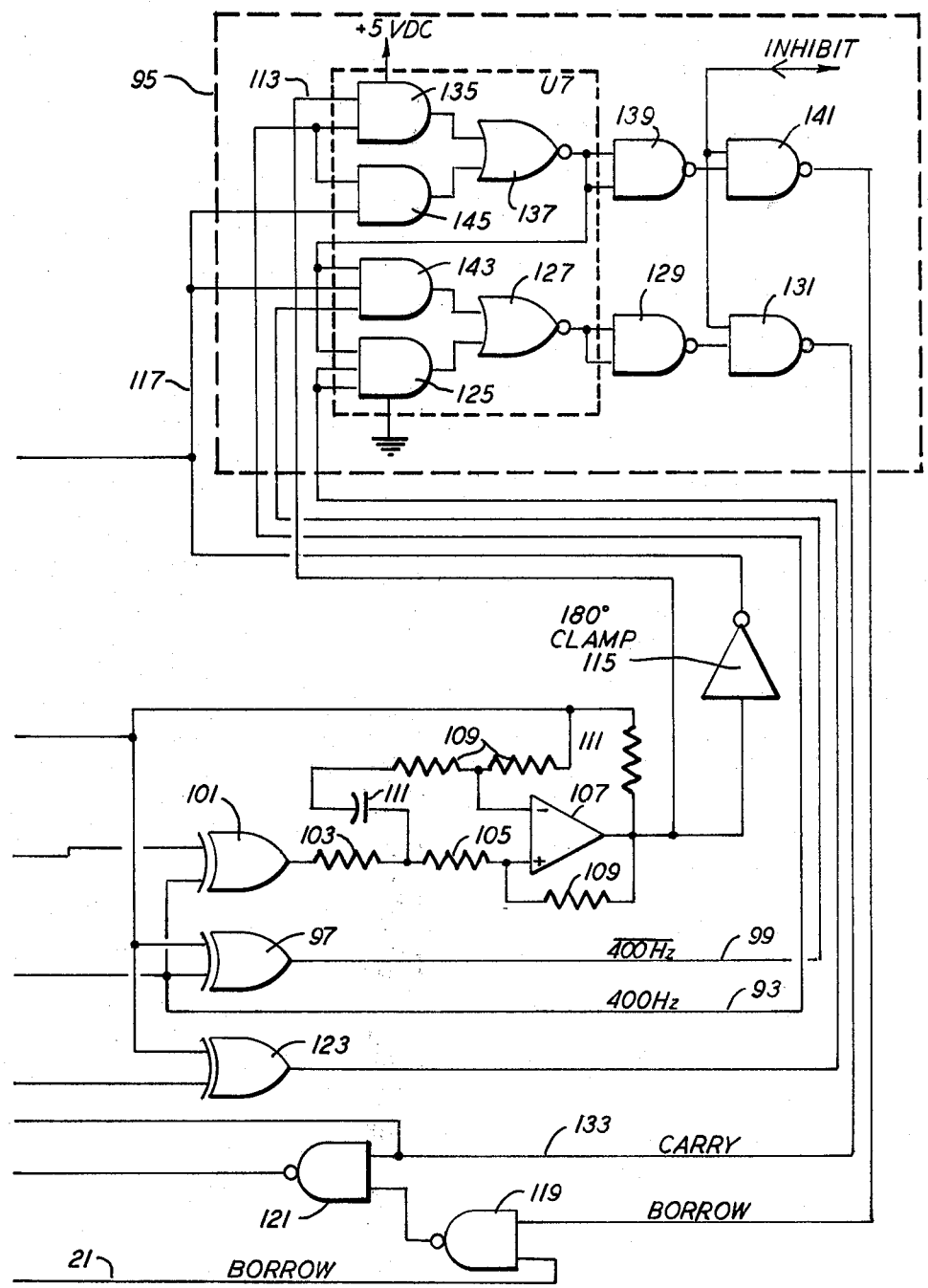

As shown in FIG. 1, the present invention includes a fine converter 11 receiving as inputs the sine and cosine signals from the 16x resolver and providing as outputs, from an internal 12 bit counter, the 12 least significant bits of a digital word representing shaft angle. This converter will preferably be the type of converter disclosed in detail in U.S. Pat. No. 4,164,729. As noted above, that converter is a 14 bit converter. The other two bits of what is the internal counter in that patent are brought to the outside for reasons which will become more apparent below. Referring to U.S. Pat. No. 4,164,729, particularly FIG. 4c the counter 125d therein, rather than being contained within the converter, is brought outside and is now a 2 bit counter 13. The carry and borrow inputs to this counter are obtained from the previous counter stage 125c in the converter. The two outputs of this counter, which represents the most significant bit and next most significant bit of the 14 bit conversion, are coupled back into the fine converter 11 on lines 15 and 17.

The reason that the counter must be removed and made external is that the carry and borrow outputs on lines 19 and 21 of FIG. 1 are not avaliable from the module 125d used in the conventional 14 bit converter. Thus, in effect the converter 11 and counter 13 together comprise the converter shown in the aforementioned U.S. Patent with the exception that the two bit counter 13 is external and has avaliable carry and borrow outputs on lines 19 and 20. The two bit counter 13 is of conventional design, i.e., it is a conventional up-down, two bit counter. Operation of the fine converter is conventional in every respect and is as disclosed in the aforementioned patent. Thus, the converter converts the input sine and cosine signals into a 14 bit digital word representing the shaft angle of the fine resolver. Furthermore, as noted above, during normal tracking operation, the fine converter is in control. The carry and borrow outputs on lines 19 and 21 are fed to a combine logic block 23. Absent inputs on lines 25 and 27, the combine logic acts like a closed switch to these signals and provides them as outputs on lines 29 and 31 to a 4 bit internal counter within a coarse converter 33. In the illustrated embodiment, the coarse converter carries out a 6 bit conversion, the most 4 significant bits being obtained from a 4 bit internal counter 35 within the coarse converter 33 and the other two bits from the two bit counter 13, on line 15 and 17. This converter too is of a conventional design and need not be particularly accurate. For example, it can be the type converter discussed in the background portion of the aforementioned U.S. Pat. No. 4,164,729 or, can be the type of converter disclosed in that patent but having only 6 bits rather than 14 bits resolution. Referring again to U.S. Pat. No. 4,164,729, particularly FIG. 3, it is noted that on line 112 there is generated an error or steering voltage. This is conventional practice in such converters. This voltage is normally used through appropriate hardware such as the demodulator, integrater and VCO shown on FIG. 3 to generate up and down counts for the internal counter, i.e., an internal counter such as counter 33, which in turn provides the circuit outputs and outputs which control switches in a ladder network in a sine-cosine generator such as the sine-cosine generator 109 of FIG. 3 of the aforementioned patent. In contrast to such an implementation however, the error voltage or steering voltage output of the coarse converter of the present invention is provided to a peak level detector 37.

Again, referring to normal operation, the carry and borrow outputs directly coupled through the combine logic 23 to lines 29 and 32 will continually update the 4 bit internal counter in the coarse converter 35 such that the digital angle provided as an input to its sine-cosine generator should be approximately equal to the digital angle represented by the 1x sine and cosine inputs. Thus, it will always be near a null when properly tracking. However, should a large error develop, indicating that the coarse position is improper, peak level detector 37 will respond and provide an output on line 25. The phase at which this peak occurs will indicate whether or not a carry or borrow input is necessary to bring the coarse converter back to the proper position. Thus, within the combine logic 23 that is combined with a 400 Hz square wave signal, acting as a clock signal on line 28 to provide an output on one of the lines 29 and 31 at the 400 Hz rate to bring the 4 bit internal counter to the proper angle. Once this angle is reached, of course, the output signal of the peak level detector 37 returns to zero and normal operation resumes. In addition, the circuit includes a 180° error detector 41 which detects a 180° out of phase condition and provides an output on line 27 which causes the counter 35 to be slewed until a coarse non-null condition results. The coarse non-null condition then causes slowing through the remainder of about 180° before normal tracking under fine control is resumed.

As illustrated in FIG. 2, which illustrates all of the system except for the fine converter 11 of FIG. 1, the coarse inputs are coupled, in conventional fashion through a transformer 42 into a quadrant or octant detector circuit 43, the outputs of which are then fed to a ladder network 45. Inputs to drive the switches in ladder network 45 and in quadrant detector 43 are obtained from the 4 bit counter 35 and from lines 15 and 17 out of the two bit counter 13. The system includes a precision reference voltage source 47 comprising an operational amplifier 49 which has coupled to its non inverting input the junction of a voltage divider made up of resistors 51 and 53 of equal value, typically 10K, extending between ground and 15 volts. The amplifier has a feedback resistor, typically 5.1k, between its output and inverting input. At the output of the amplifier will be a precision reference voltage of approximately 7.5 volts. This voltage is fed back to the transformer 42 and used to center the sine and cosine voltages at the input to quadrant detector 43. This precision reference voltage is coupled through a resistor 57, typically 2K, into the inverting input of the peak level detector comparator 61. The inverting input of comparator 61 is also coupled through a resistor 63 of, for example, 47K. to +15 volts. The resulting offset voltage is utilized to insure that narrow peaks are obtained at the peak level detector. The non-inverting input of comparator 61 is coupled through a resistor 65, typically a 3K resistor, to the output of the ladder network 45 at which the steering voltage appears. The output of the comparator 61 is coupled back to its non-inverting input through a resistor 67, typically 1M. A pull-up resistor 69 is provided between the output and +15 volts. This resistor can typically be a 10K resistor.

The 400 Hz reference signal is provided as an input through a capacitor 71 typically 0.1 uf and a resistor 75 typically 1K to the non-inverting input of an amplifier 73. The junction of the capacitor 71 and resistor 75 is coupled through a resistor 77, typically 10K, to +5 volts dc, which is also coupled to the inverting input of an amplifier 73. The output of amplifier 73 is coupled through a resistor 79 to +5 volts, this resistor acting as a pull-up resistor. Amplifier 73 with its associated resistor comprises a squaring amplifier which squares the sinusodial reference voltage. The output of the amplifier 73 is a 400 Hz square wave signal which is utilized for slewing.

A second squaring amplifier 81 is provided having its non-inverting input coupled through a resistor 83, typically 1K, to the one of the outputs of the quadrant detector, through a switch in block 45. Amplifier 81 has a feed back resistor 85, typically 100K, and a pull up resistor 10K, coupling its output to 5 volts dc. In a system of this nature, the sine input signal will be in phase with the reference voltage and the cosine signal out of phase. In the quadrant detectant circuit, a selection is made to couple the proper ones of the sine and cosine inputs to the ladder network in order to get the proper null. This means that sometimes the input to amplifier 81 will be in phase and at other times will be out of phase with the reference signal. Thus, in order to insure that the same phase is always present out of this circuit an exclusive OR gate 91 having as one input the output of amplifier 81 and as a second input the 45° bit or third most significant bit of the coarse conversion is provided. This bit, in effect, indicates which of the sine or cosine are larger. Thus, if this bit is not present, indicating that the cosine is present and is the larger of the signals, the output of amplifier 81 is simply passed through the gate 91. Otherwise, if the 45° bit is present, the exclusive OR gate 91 acts as an inverter. This happens only when the sine is larger and thus the same phase is present in both cases. This circuit constitutes part of the 180° ambiguity circuit mentioned above.

The 400 Hz signal out of the amplifier 73 is fed directly over line 93 to a gating arrangement 95 which constitutes the major portion of the combine logic 23 of FIG. 1. In addition, the 400 Hz signal is inverted through an exclusive OR gate 97, having its other input tied to +5 volts dc, to establish a $\overline{400\ Hz}$ signal on line 99. The signal on line 93 is fed to a gate 101 having as its second input the output of gate 91. If the reference signal is in phase with the output of gate 91, the output of gate 101 will be essentially 0 since it is an exclusive OR gate. However, if, because of an 180° ambiguity, the two signals are out of phase the output of gate will be a logical 1. The output of gate 101 is fed through resistors 103 and 105, typically 10K and 1K, respectively, to the non-inverting input of an amplifier 107 having positive feedback through a resistor 109, typically a 100K. At the output of the amplifier 107 is a pull up resistor 111 coupling the output to +5 volts dc. The non-inverting input of amplifier 107 is coupled to the junction of a voltage divider made up of resistors 109 both of equal value, typically 5.1K, extending between +5 volts and ground. From the junction between resistors 103 and 105, a capacitor 111 extends to ground. This capacitor performs a storage and smoothing function at the input of amplifier 107. For example, if there is a small phase discrepancy between the two inputs to gate 101, and a small output, it prevents the amplifier 107 from responding. Alternatively small gaps in the resulting output signal when the two inputs are out of phase will be smoothed out by the capacitor to give an essentially constant signal approaching a logical 1. The output of the amplifier 107 is provided on line 113. In addition, this output is inverted through an inverter 115 to provide, on a line 117, a 180° clamp which clamps the output of the peak level comparator 61 to 0 volts in case of a 180° ambiguity. In effect, this gives the 180° ambiguity circuit priority over the coarse circuit so that before any other corrections are made, any existing 180° ambiguity will be corrected.

The borrow output from two bit counter 13 on line 21 is coupled through a NAND gate 119 and another NAND gate 121 to the down input of counter 35. In normal operation, carry outputs from counter 13 on line 21 pass directly through these gates into counter 35. The carry output on line 29 is coupled through an exclusive OR gate inverter 123 to two of the inputs of a NAND gate 125. The output of NAND gate 125 is one input to NOR gate 127 the output of which is then coupled through a NAND gate inverter 129 and inhibit NAND gate 131 and on line 133 to the up input of counter 35. Again during normal operation, carry pulses from the counter 13 on line 19 are coupled through this path directly to the up input of counter 35.

If a 180° ambiguity occurs, in addition to clamping the input of amplifier 61, the output on line 113 appears at an AND gate 135. The second input to AND gate 135 is the 400 Hz signal on line 93. AND gate 13, thus enabled, provides a 400 Hz output to NOR gate 137. This output is coupled through an inverting NAND gate 139 and an inhibit NAND gate 141 to NAND gate 119. This signal will be coupled through NAND gate 119 and NAND gate 121 to the down input of counter 35 and will slew counter 35 until the 180° ambiguity is corrected, at which time the signal on line 113 will disappear. The output of gate 137 is also coupled as inputs to AND gates 143 and 125. Gates 143 and 125 are associated with the generation of carry signals. The output of gate 137 acts to disable these two gates to prevent the generation of a carry signal when a borrow signal is being generated.

The output of amplifier 61 is coupled as an input to gate 143 and to gate 145. Gate 145 is utilized to generate borrow signals and gate 143 generates carry signals. As noted above, whether a borrow or carry signal is to be generated will depend on the phase of the output from the amplifier 61. Furthermore because of the 7.5V. offset, the output from the comparator or amplifier 61 will be a pulse which occurs in the middle of a 400 Hz half cycle. This pulse can occur either during the positive cycle or the negative half cycle. If it occurs during the positive half cycle, it will be at a logical one at the same time as the signal on line 93, the second input to gate 145, is at a logical one. Thus, gate 145 will have an output which will be coupled through OR gate 137, NAND gate 139 and NAND gate 141 to generate a borrow signal. This borrow signal will further be coupled through NAND gate 119 and NAND gate 121 into the counter 35. To prevent, at the same time generating a borrow and carry signal, and gate 121 has as its second input a carry signal from gate 131. Thus, if for any reason a carry signal is present, the borrow signal will not be able to pass through gate 121 so that the counter 35 will not be instructed to change in both directions at the same time.

If the pulse output of amplifier 61 occurs during the negative half cycle then it will be present at gate 143 at the same time as the output on line 99 which provides the second input to gate 143. As long as there is not at the same time a command to borrow, caused by a 180° ambiguity, gate 143 will thus be enabled and the pulse from amplifier 61 will pass through gate 143, gate 127, gate 129 and gate 131 generating a carry signal which is then provided to the up input of counter 35. For as long as the error at the input to comparator 61 and inputs will be provided to counter 35 at the 400 Hz rate to slew the counter and null the coarse signal.

The borrow signal on line 41 is coupled only through gates 119 and 121 to reach the counter 35. Gate 121 insures that a borrow signal can not be generated if a carry signal is being generated. The carry signal on line 19 is coupled through the gates 125, 127, 129 and 131. The purpose of going through this path is to be able to disable the generation of a carry signal when the second input to gate 125 is not present due to an output from gate 137 indicating a borrow condition, particularly a condition where a slew to correct a 180° ambiguity is taking place.

There are thus, three levels of priority in the coarse system. Top priority is given to a 180° ambiguity. If such a condition is detected by amplifier 107 the output of the comparator 61 is clamped and the gate 135 enabled to pass 400 Hz pulses to slew the counter 35 until a coarse non-null is reached. The second level of priority is a coarse error. When the coarse error out of the ladder 45 exceeds a pre-set level set into the peak level comparator 61, the output from this comparator enables gates 143 and 145 either during the positive half cycle or the negative half cycle. Depending on the half cycle during which the pulse from the comparator 61 occurs either a borrow or carry signal is generated, at the 400 Hz rate which is coupled into the counter 35 causing it to count up or down to null out the coarse converter. The outputs of the 4 bit counter 35, along with the output of the 2 bit counter are utilized to control the quadrant or octant switching and the ladder network in the 6 bit coarse converter in conventional fashion.

The third level is normal tracking operation where counter 35 is updated by outputs from the fine converter (counter 13). The purpose of the gates 131 and 141 is to inhibit the coarse converter operation when the fine converter is inhibited. Again, with reference to U.S. Pat. No. 4,164,729, it will be noted there is an inhibit line 381 shown on FIG. 4c. The second inputs to gates 141 and 131 are obtained from this line.

Furthermore, although the present invention has been explained in terms of a 16 to 1 fine to coarse two speed resolver, other ratios are possible for example, 2 to 1, 4 to 1, and 8 to 1. In general terms, if the output resolution desired is designated as being n bits and if the number of times the fine servo rotates for one rotation of the coarse resolver is designated as m, the coarse resolver must have a counter with n-r stages where m is equal to $2^r$. If overlap is designated as p, then the coarse converter must include selection and converting means i.e. quadrant or octant selecting means and a ladder capable of converting the 1x sine and cosine signals into an r+p bit output. The selection and converting means will receive its r most significant bits from its internal counter and its p least significant bits from the counter in the fine converter. It is recommended that p be at least equal to 2, although in some cases an overlap of one may be possible. Thus, for example with a ratio of 4 to 1 and assuming that 14 bits are obtainable in a conventional converter and again assuming 2 bit overlap one would require a 3 bit counter in the coarse converter. In that case the conversion in the converting section would be accomplished with 5 bits. Alternativley a 3 bit overlap could be provided with a 6 bit conversion maintained. Of course, with the 3 bit overlap, in accordance with the illustrated embodiment of the present invention, counter 13 would then be a 3 bit counter. These and other modifications can be made without departing from the spirit of the invention which is intended to be limited solely by the appended claims.

We claims:

1. A two speed resolver to digital converter for converting 1x sine and cosine signals and mx sine and cosine signals of a two speed resolver into an n bit digital word comprising:

a. a fine (n−r) bit resolver to digital converter having said mx sine and cosine signals as inputs including a (n−r) bit counter, where $m=2^r$, having carry and borrow outputs from its most significant stage, and providing as outputs the (n−r) least significant bits of said n bit digital word;

b. a (r+p) bit coarse converting means including:

(i) an r bit, up-down counter providing as an output the r most significant bits of said n bit digital word, having up and down inputs;

(ii) selection and converting means having as inputs said 1x sine and cosine signals, the r bits from said r bit counter the the p most significant bit outputs of said (n−r) bit counter and providing a steering voltage output proportional in magnitude to the difference between the resolver shaft angle represented by said sine and cosine signals and the angle represented by said r and p bits and of a phase determined by the direction of said difference;

(iii) a peak level detector having as an input said steering voltage and providing a control output when said steering voltage exceeds a predetermined level;

(iv) means for generating a clock signal;

(v) combining logic having as inputs said clock signal, the output of said level detector and the carry and borrow outputs from said internal counter and coupling said carry and borrow outputs to up and down inputs of said bit counter, respectively when said control output is not present and coupling said clock signal to one of said up and down inputs when said control signal is present, in dependence on the phase of said steering voltage.

2. The converter according to claim 1 wherein said means for generating a clock signal comprises means to square the reference voltage supplied to said converter and resolver and further comprising means to invert said clock signal so as to provide an inverted clock signal and wherein said combining logic includes a first gate having as inputs the output of said detector and said clock signal and a second gate having as inputs the output of said detector and said inverted clock signal, the output of one of said gates coupled to said up input and the output of the other to said down input of said r bit counter.

3. The converter according to claim 2 and further including:

a. means to select the one of the 1x sine and cosine inputs which is larger;

b. means to square said larger signal to provide a squared signal;

c. means responsive to selection of one of said signals to invert said signal and to selection of the other signal to transmit said signal not inverted, providing as an output a synthetic reference signal; and d. means to compare the phase of said clock signal with said synthetic reference signal and provide a slew output when said signals are out of phases.

4. A converter according to claim 3 and further including means to clamp the output of said detector when said slew signal is present.

5. A converter according to claim 3 wherein said means to compare comprise an exclusive OR gate; means to smooth the output of said exclusive OR gate to provide a smoothed output; and comparison means responsive to said smoothed output exceeding a predetermined level to generate said slew signal.

6. A converter according to claim 1 wherein n=18, m=16, r=4, N−r=4 and p=2.

7. A method of converting the 1x and mx sine and cosine signals from a two speed resolver into an n bit digital word comprising:
 a. converting the fine, 1x sine and cosine outputs in a conventional high accuracy resolver to digital converter which includes an $n-r$ bit counter where $m=2^r$, said counter being provided with carry and borrow outputs from its most significant stage, said converter providing the $n-r$ least significant bit of the n bit digital word;
 b. during normal operation using the borrow and carry outputs to update a r bit coarse counter, said r bit coarse counter providing the most r significant bits of said n bit digital word;
 c. utilizing said r most significant bits and the p most significant bits from the counter of the fine converter to develop with conventional selection and converting means a steering voltage which has a magnitude representing the difference between the coarse resolver shaft angle and the angle represented by said $r+p$ bits and a phase indicating the direction of the error;
 d. detecting when said steering voltage exceeds a predetermined value representing a non-null situation in the coarse counter; e. in response to detecting said non-null situation supplying to said r bit counter a stream of clock pulses at frequency which will cause said counter to slew to a null condition.

8. The method of claim 7 comprising using as the clock signal for slewing said coarse counter the reference frequency used in said converter and resolver.

9. The method according to claim 8 and further including sensing the phase relationship between said reference and one of the coarse sine and cosine inputs and when said phase relationship indicates a 180° ambiguity supplying said clock signal to said coarse counter to slew said coarse counter 180° to eliminate said ambiguity.

10. The method according to claim 9 and further including preventing updating of said coarse counter in response to a detected error while slewing to correct an ambiguity.

* * * * *